US012707935B2

(12) United States Patent
Guo et al.

(10) Patent No.: US 12,707,935 B2
(45) Date of Patent: Aug. 11, 2026

(54) CHIP BONDING METHOD

(71) Applicant: WUHAN XINXIN SEMICONDUCTOR MANUFACTURING CO., LTD., Wuhan (CN)

(72) Inventors: Wanli Guo, Wuhan (CN); Tianjian Liu, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 679 days.

(21) Appl. No.: 18/256,026

(22) PCT Filed: Feb. 25, 2021

(86) PCT No.: PCT/CN2021/077987

§ 371 (c)(1),
(2) Date: Jun. 5, 2023

(87) PCT Pub. No.: WO2022/121119

PCT Pub. Date: Jun. 16, 2022

(65) Prior Publication Data

US 2024/0063174 A1 Feb. 22, 2024

(30) Foreign Application Priority Data

Dec. 10, 2020 (CN) ......................... 202011473320.0

(51) Int. Cl.
*H10P 72/70* (2026.01)
*H10W 72/00* (2026.01)

(52) U.S. Cl.
CPC ...... *H10P 72/7402* (2026.01); *H10P 72/7416* (2026.01); *H10W 72/073* (2026.01); *H10W 72/07337* (2026.01)

(58) Field of Classification Search
None
See application file for complete search history.

(56) References Cited

U.S. PATENT DOCUMENTS 9,935,072 B2 4/2018 Jeong et al.
2009/0280602 A1* 11/2009 Bonifield .............. B81C 1/0023 438/118

(Continued)

FOREIGN PATENT DOCUMENTS

CN 102760699 A 10/2012
CN 104134615 A 11/2014

(Continued)

*Primary Examiner* — Erik T. K. Peterson
(74) *Attorney, Agent, or Firm* — MUNCY, GEISSLER, OLDS & LOWE, P.C.

(57) ABSTRACT

A die bonding method includes temporarily bonding a first carrier wafer to a front side of a device wafer, so that a back-side connection structure can be formed on a back side of the device wafer to lead out an interconnect structure in the device wafer to the back side of the device wafer. Moreover, through bonding a second carrier wafer to the back side of the device wafer, the first carrier wafer can be debonded. After the device wafer and the second carrier wafer are debonded, a second bonding adhesive is retained in order to provide protection to the back side of the device wafer during the subsequent dicing of the device wafer and to avoid particles or etching by-products produced during the dicing process from adhering to the back side of the device wafer.

13 Claims, 6 Drawing Sheets

(56) References Cited

U.S. PATENT DOCUMENTS

2012/0056329 A1* 3/2012 Pagaila ................. H10W 90/00
438/109
2013/0078767 A1* 3/2013 Yim .................... H10P 72/7402
257/E21.499
2017/0005070 A1* 1/2017 Kelly ...................... H10P 54/00
2017/0148756 A1* 5/2017 Yu ........................... H10P 54/00

FOREIGN PATENT DOCUMENTS

CN 105810590 A 7/2016
CN 107665828 A 2/2018
CN 110858552 A 3/2020
CN 111933583 A 11/2020

* cited by examiner

CHIP BONDING METHOD

TECHNICAL FIELD

The present invention relates to die packaging technology and, in particular, to a die bonding method.

BACKGROUND

As semiconductor technology steps into the post-Moore's law era, catering to the demand for higher integration and higher performance, chip structures are evolving toward three-dimensional (3D) stacking. "Heterogeneous hybrid" integration realized by bonding strategies is one of the important "More than Moore" (MtM) techniques. Such a bonding process is capable of high-density interconnection of dies from different technology process nodes, enabling system-level integration with a smaller size, higher performance and lower power consumption. The existing bonding methods typically include wafer-to-wafer (W2W) bonding, chip-to-chip (C2C) bonding and chip-to-wafer (C2W) bonding. C2W bonding is favored by global semiconductor giants because it can screen out defective dies and enables a high yield.

C2W bonding can be achieved by simple metal bonding, or by hybrid bonding with higher bonding strength. Since hybrid bonding is advantageous in higher I/O connection density and better heat dissipation, it has found extensive use. Hybrid bonding is extremely demanding on die surface cleanness. However, at present, a wafer is diced into individual dies typically by cutting the wafer with a grinding wheel until a substrate of the wafer is reached and then etching through the substrate. Particles produced during the grinding operation and etching by-products resulting from the etching process, which may lead to poor hybrid bonding quality, tend to adhere to the surface of the resultant dies and are difficult to remove.

SUMMARY OF THE INVENTION

It is an objective of the present invention to provide a die bonding method, which can ensure die surface cleanness and hence improved bonding quality.

To this end, the present invention provides a die bonding method including:

- providing a device wafer, coating a first bonding adhesive on a front side of the device wafer and temporarily bonding a first carrier wafer thereto;
- forming a first hybrid bonding structure on a back side of the device wafer;
- coating a second bonding adhesive on the first hybrid bonding structure and temporarily bonding a second carrier wafer thereto;
- debonding the device wafer and the first carrier wafer, and removing the first bonding adhesive;
- debonding the device wafer and the second carrier wafer, the second bonding adhesive being retained;
- dicing the device wafer from the back side thereof into a plurality of individual dies; and
- removing the second bonding adhesive, providing a target wafer formed on a surface thereof with a second hybrid bonding structure and bonding good ones of the dies at their back sides to the target wafer with the aid of the first and second hybrid bonding structures.

Optionally, all the dies on the device wafer may be tested and the good ones of them may be marked, before the first bonding adhesive is coated on the front side of the device wafer.

Optionally, the method may further include: attaching an adhesive film to the front side of the device wafer, after the first bonding adhesive is removed; and testing all the dies on the device wafer and marking the good ones of them, after the first bonding adhesive is removed and before the adhesive film is attached to the front side of the device wafer.

Optionally, the method may further include, before the first hybrid bonding structure is formed on the back side of the device wafer, forming a back-side connection structure on the back side of the device wafer, the back-side connection structure electrically connected to a first interconnect structure in the device wafer, the back-side connection structure including TSVs and pads.

Optionally, the device wafer may include a substrate, a dielectric layer on the substrate and a first interconnect structure formed in the dielectric layer, wherein the step of dicing the device wafer from the back side thereof into the individual dies includes:

- cutting at least the second bonding adhesive and the first hybrid bonding structure from the back side of the device wafer to form horizontal and vertical first dicing lanes, which expose a surface of the substrate or further extend into the substrate; and
- performing an etching process along the first dicing lanes, which proceeds downward at least through the substrate, thereby completely separating adjacent dies.

Optionally, after the etching process proceeds along the first dicing lanes downward through the substrate, the dielectric layer may be etched or cut through, thereby completely separating adjacent dies.

Alternatively, second dicing lanes may be pre-formed in the dielectric layer before the horizontal and vertical first dicing lanes are formed, which extend at least through the dielectric layer and define the individual dies, wherein the first dicing lanes are aligned with the respective second dicing lanes, and the etching process proceeds along the first dicing lanes downward until the second dicing lanes connect with the respective first dicing lanes, thereby separating adjacent dies.

Optionally, after the second bonding adhesive is removed, the adhesive film may be stretched to widen gaps between adjacent dies.

Optionally, each of the first and second hybrid bonding structures may include an insulating bonding layer and conductive bonding pads, the conductive bonding pads located within the insulating bonding layer, the conductive bonding pads in the first hybrid bonding structure electrically connected to the back-side connection structure, the conductive bonding pads in the second hybrid bonding structure electrically connected to a second interconnect structure in the target wafer.

Optionally, after the second bonding adhesive is removed and before the good dies are bonded at their back sides to the target wafer with the aid of the first and second hybrid bonding structures, the insulating bonding layer(s) of the first hybrid bonding structure and/or the second hybrid bonding structure may be activated with plasma.

Optionally, a material of the conductive bonding pads in the first hybrid bonding structure may include copper, wherein an time interval from the formation of the first hybrid bonding structure on the back side of the device wafer to the coating of the second bonding adhesive on the first hybrid bonding structure is defined as a first waiting time and a time interval from the removal of the second bonding adhesive to the bonding of the good dies at their back sides to the target wafer with the aid of the first and second hybrid bonding structures as a second waiting time, and the sum of the first and second waiting time is shorter than or equal to 24 hours.

Optionally, both the device wafer and the target wafer may have undergone a redistribution layer forming process and an aluminum pad forming process.

Optionally, the second bonding adhesive may be removed using a wet cleaning process.

The die bonding method of the present invention provides the following benefits:

1) Through temporarily bonding the first carrier wafer to the front side of the device wafer, the back-side connection structure can be formed on the back side of the device wafer to lead out the interconnect structure in the device wafer to the back side of the device wafer. Moreover, through bonding the second carrier wafer to the back side of the device wafer, the first carrier wafer can be debonded. Further, after the device wafer and the second carrier wafer are debonded, the second bonding adhesive is retained, in order to provide protection to the back side of the device wafer during the subsequent dicing of the device wafer, and to avoid particles or etching by-products produced during the dicing process from adhering to the back side of the device wafer. Such particles or etching by-products are subsequently removed along with the second bonding adhesive, ensuring cleanness of the back sides of the individual dies resulting from the dicing process and improved quality of bonding of the back sides of the dies to the target wafer.
2) During the dicing of the device wafer, the second bonding adhesive remaining on the front side of the device wafer can function in the same way as photoresist. As the etchant used in the etching of the substrate generally shows a high selectivity to the adhesive, the adhesive can protect the front side of the device wafer against possible damage that may be caused by the etching process, dispensing with the need for additional photoresist coating and exposure. This results in increases in process simplicity and production efficiency.
3) The first carrier wafer is debonded after the second bonding adhesive is coated and the second carrier wafer is bonded. With the back side of the device wafer being protected by the second bonding adhesive, no process step or process complexity will be added.
4) The conductive bonding pads in the first hybrid bonding structure are often made of copper, which is susceptible to oxidation that may lead to degraded bonding quality. The second bonding adhesive retained after the device wafer and the second carrier wafer are debonded can prevent to some extent the conductive bonding pads in the first hybrid bonding structure from being oxidized, resulting in improved bonding quality.
5) The time interval from the formation of the first hybrid bonding structure on the back side of the device wafer to the coating of the second bonding adhesive on the first hybrid bonding structure is defined as a first waiting time, and the time interval from the removal of the second bonding adhesive to the bonding of the good dies from the device wafer at their back sides to the target wafer with the aid of the first and second hybrid bonding structures as a second waiting time. Since the conductive bonding pads in the first hybrid bonding structure is exposed in air during the first and second waiting times, the sum of the first and second waiting times is controlled within 24 hours or shorter, thereby additionally preventing the conductive bonding pads in the first hybrid bonding structure from being oxidized.
6) Compared with testing the device wafer and marking good dies thereon after the completion of the fabrication thereof, testing the device wafer and marking good dies thereon after the removal of the first bonding adhesive enables screening out of any die that becomes defective during the bonding of the first carrier wafer or during the formation of the back-side connection structure, resulting in an increased yield of the resultant bonded dies.
7) After the second bonding adhesive is removed and before the good dies are bonded at their back sides to the target wafer, the insulating bonding layer(s) of the first hybrid bonding structure and/or the second hybrid bonding structure may be activated with plasma to enhance its/their bonding strength. As a result, the good dies can be pre-bonded to the target wafer at room temperature and atmospheric pressure, reducing the requirements on the bonding process and broadening the process window.

100—device wafer; 100*a*—front side of the device wafer; 100*b*—back side of the device wafer; 110—first substrate; 120—first hybrid bonding structure; 122—first insulating bonding layer; 121—first conductive bonding pad; 130—first interconnect structure; 140—back-side connection structure; 150—first dielectric layer;

200—target wafer; 200*a*—front side of the target wafer; 200*b*—back side of the target wafer; 210—second substrate; 220—second hybrid bonding structure; 222—second insulating bonding layer; 221—second conductive bonding pad; 230—second interconnect structure; 250—second dielectric layer;

310—first carrier wafer; 320—second carrier wafer; 410—first bonding adhesive; 420—second bonding adhesive; 500—adhesive film; 100*c*—die; 100*d*—good die from the device wafer.

DETAILED DESCRIPTION

Specific embodiments of the present invention will be described in greater detail below with reference to the accompanying schematic drawings. Advantages and features of the present invention will become more apparent from the following description. Note that the figures are provided in a very simplified form not necessarily drawn to exact scale and for the only purpose of facilitating easy and clear description of the embodiments.

Figure 1:
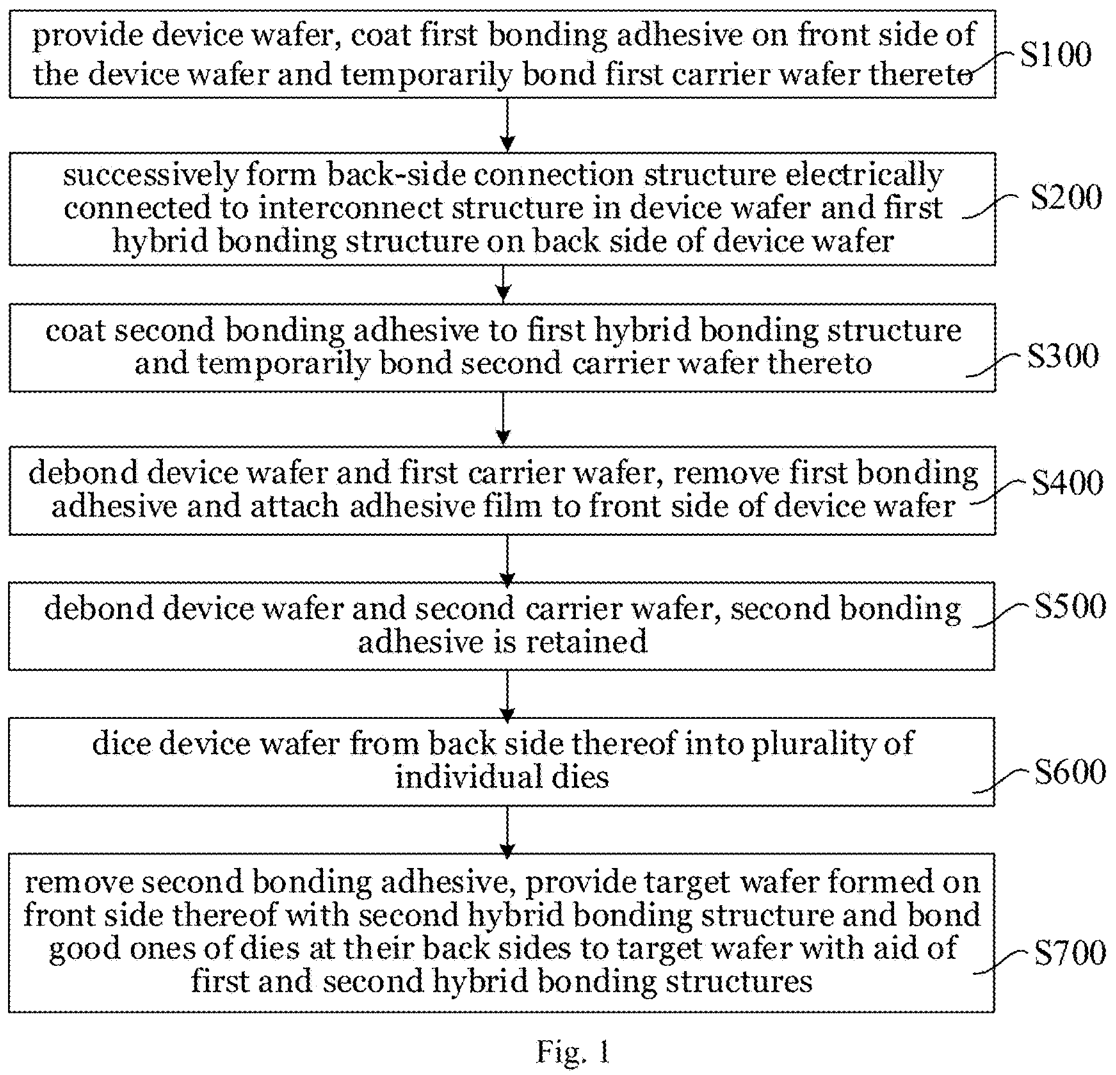
FIG. 1 is a flowchart of a die bonding method according to an embodiment of the present invention.

FIG. 1 is a flowchart of a die bonding method according to an embodiment of the present invention. As shown in FIG. 1, the die bonding method includes the steps of:

step S100: providing a device wafer, coating a first bonding adhesive on a front side of the device wafer and temporarily bonding a first carrier wafer thereto;

step S200: forming a first hybrid bonding structure on a back side of the device wafer;

step S300: coating a second bonding adhesive to the first hybrid bonding structure and temporarily bonding a second carrier wafer thereto;

step S400: debonding the device wafer and the first carrier wafer, removing the first bonding adhesive and attaching an adhesive film to the front side of the device wafer;

step S500: debonding the device wafer and the second carrier wafer, with the second bonding adhesive being retained;

step S600: dicing the device wafer from the back side thereof into a plurality of individual dies; and step S700: removing the second bonding adhesive, providing a target wafer formed on a front side thereof with a second hybrid bonding structure and bonding good ones of the dies at their back sides to the target wafer with the aid of the first and second hybrid bonding structures.

Reference is now made specifically to FIGS. 2*a*, 2*b*, and 3 to 13, which are schematic illustrations of structures resulting from corresponding steps in a die bonding method according to an embodiment of the present invention. The method will be described in detail below with reference to FIGS. 2*a*, 2*b*, and 3 to 13.

Figure 2A:
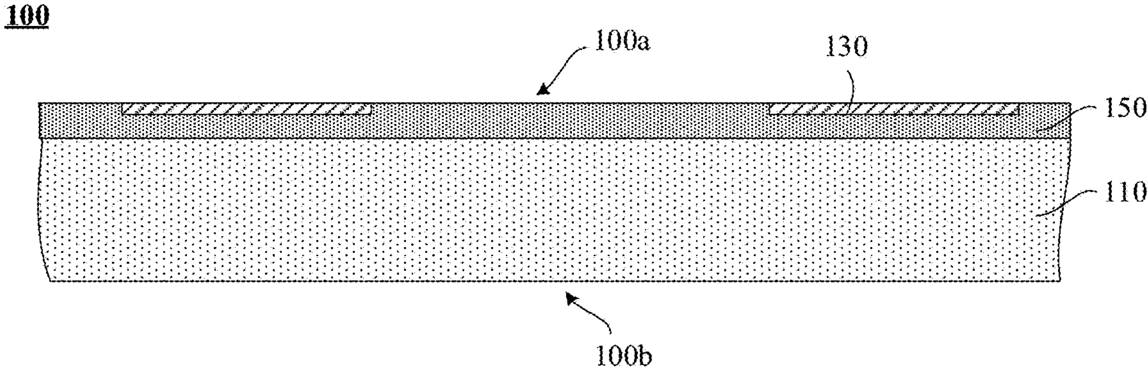
FIGS. 2*a*, 2*b*, and 3-13 are schematic illustrations of structures resulting from corresponding steps in a die bonding method according to an embodiment of the present invention.

First of all, referring to FIG. 2*a*, in step S100, a device wafer 100 is provided. The device wafer 100 includes a first substrate 110, in the first substrate 110 first device structures are formed. A first interconnect structure 130 electrically connected to the first device structures are formed on the first substrate 110. The first interconnect structure 130 is embedded within a first dielectric layer 150. The first dielectric layer 150 may include multiple layers. For example, it may include an interlayer dielectric layer and an inter-metal dielectric layer. As such, the first interconnect structure 130 is wrapped by the dielectric material. The first device structures may be MOS devices, sensor devices, storage devices and/or other passive devices.

The first interconnect structure 130 may include multiple layers (represented by one layer in FIG. 2*a* for the illustrative purpose). The layers may be interconnected by electrical connections such as contact plugs, wiring layers, and/or vias. The first interconnect structure 130 may be formed of a metal material such as tungsten, aluminum or copper.

The device wafer 100 has a front side 100*a* and a back side 100*b*. The first interconnect structure 130 is formed on the front side 100*a* of the device wafer 100, and the back side 100*b* is opposite the front side 100*a*. In order to facilitate subsequent bonding, according to this embodiment, the front side 100*a* of the device wafer 100 has been subjected to redistribution layer forming process and aluminum pad forming process. That is, aluminum pads have been formed on the front side 100*a* of the device wafer 100. The aluminum pads can lead out electrical signals from the device wafer 100, which are necessary for testing.

Further, horizontal and vertical second dicing lanes may have been formed in the first dielectric layer 150 in advance by cutting the front side 100*a* of the device wafer 100 with a grinding wheel. The second dicing lanes may extend at least through the first dielectric layer 150 and terminate at the first substrate 110. Alternatively, it may further extend into the first substrate 110. Adjacent second dicing lanes may define beforehand a plurality of individual dies on the device wafer 100.

Figure 3:
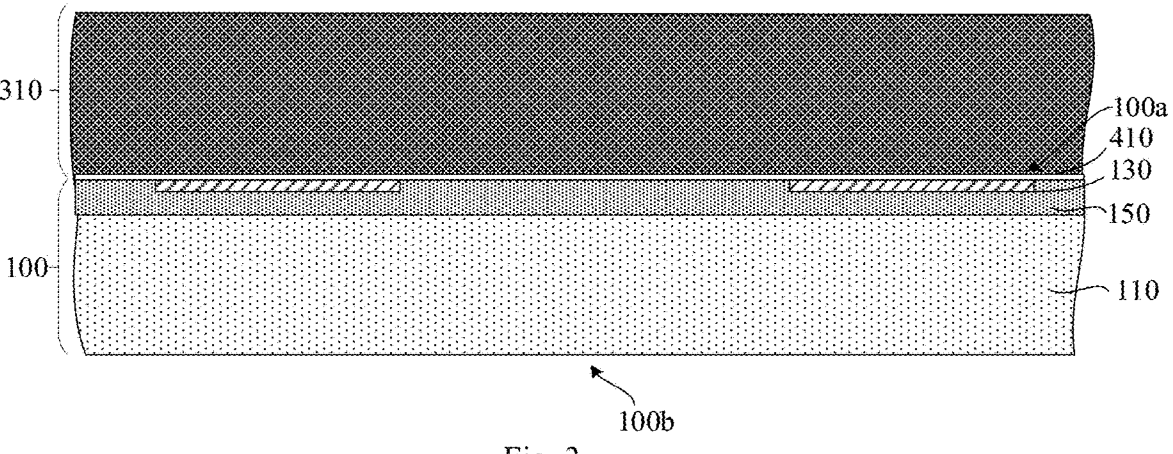

Referring to FIG. 3, a first bonding adhesive 410 is coated on the front side 100*a* of the device wafer 100, and a first carrier wafer 310 is temporarily bonded to the front side 100*a* of the device wafer 100 by the first bonding adhesive 410. The first carrier wafer 310 may be a single-layer wafer intended only to provide support. Therefore, it may be a substrate that has not undergone any device fabrication process. For example, it may be a silicon substrate, a glass substrate or a support substrate made of a different material. As a result of the temporary bonding of the first carrier wafer 310 and the device wafer 100 achieved by the first bonding adhesive 410, the device wafer 100 is firmly attached to the first carrier wafer 310, facilitating the subsequent formation of a back-side connection structure and a hybrid bonding structure.

Figure 4:
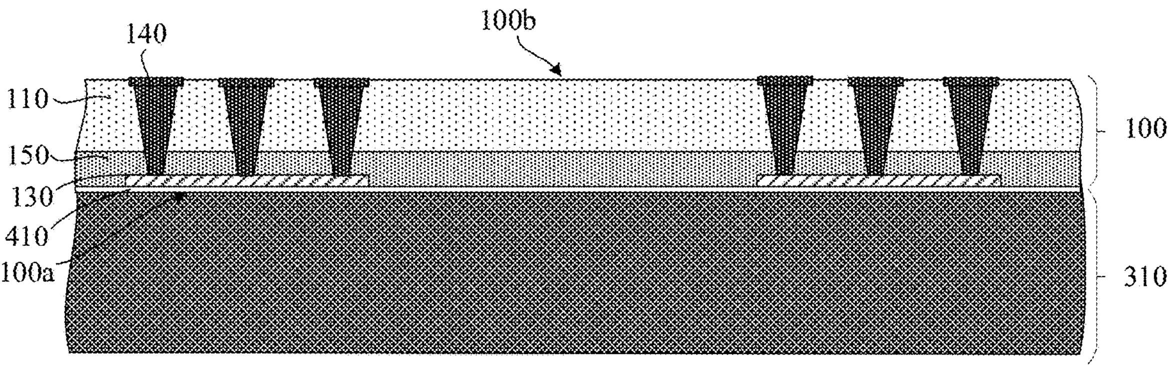

Referring to FIG. 4, in step S200, the device wafer 100 may be thinned from the back side 100*b*. Specifically, a thickness of the first substrate 110 may be reduced by performing a polishing process thereon. This can avoid the formation of deep through-silicon via (TSV) holes in the first substrate 110 by etching and filling of a significant amount of a metal material during the subsequent formation of the back-side connection structure.

With continued reference to FIG. 4, with support of the first carrier wafer 310, a back-side connection structure 140 is formed on the back side 100*b* of the device wafer 100. The back-side connection structure 140 is electrically connected to the first interconnect structure 130, thereby leading out the first interconnect structure 130. The formation of the back-side connection structure 140 may particularly include the following steps. A dielectric layer (e.g., a silicon oxide layer, not shown) may be deposited on the back side 100*b* of the device wafer 100, and a mask layer (not shown) may be then formed on the dielectric layer. The mask layer may be a photoresist layer. Subsequently, a photolithography process may be carried out to pattern the mask layer. Next, with the mask layer serving as a mask, the dielectric layer and the first substrate 110 may be etched, for example, by reactive-ion etching (RIE), resulting in the formation of TSV holes extending from a surface of the first substrate 110 to the first interconnect structure 130 (typically to interconnecting wires on the top of the first interconnect structure 130). A barrier layer may be then deposited on inner walls of the TSV holes to avoid the subsequently-filled metal material from diffusing into the first substrate 110. The barrier layer on bottom surfaces of the TSV holes may be etched away, and a metal material such as gold, silver, copper or nickel may be deposited to fill up the TSV holes and cover the first substrate 110. The metal material may be then planarized, thereby forming conductive connections in the TSV holes, which are electrically connected to the first interconnect structure 130, and pads electrically connected to the conductive connections.

Figure 5:
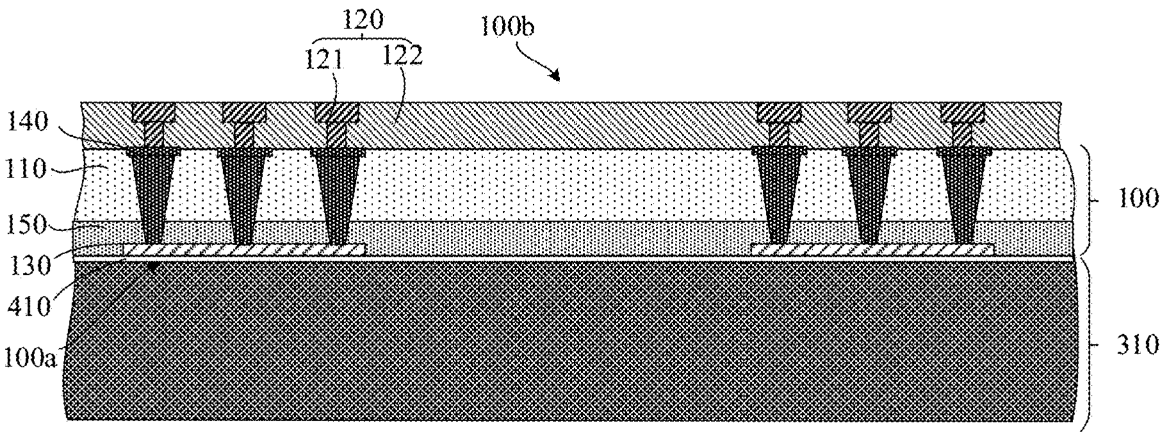

Referring to FIG. 5, a first hybrid bonding structure 120 is formed on the back-side connection structure 140, the first hybrid bonding structure 120 is also formed on the back side 100*b* of the device wafer 100. The first hybrid bonding structure 120 has a bonding interface formed by different bonding materials. In this embodiment, the first hybrid bonding structure 120 includes a first insulating bonding layer 122 and first conductive bonding pads 121. The first conductive bonding pads 121 are embedded in the first insulating bonding layer 122 and electrically connected to the back-side connection structure 140, thereby electrically leading out the first interconnect structure 130.

Optionally, the first insulating bonding layer 122 may be a dielectric material suitable for bonding. It may consist of a single layer or stacked multiple layers. For example, it may consist of silicon oxide, silicon nitride, silicon oxynitride, nitrogen-doped silicon carbide (NDC) or a combination thereof. The first conductive bonding pads 121 are made of a conductive bonding material such as a metal bonding material such as copper, gold or an alloy.

The formation of the first hybrid bonding structure 120 may include: forming an insulating layer on the back side 100*b* of the device wafer 100; etching the insulating layer to form openings therein, with the remainder serving as the first insulating bonding layer 122; and finally, forming the first conductive bonding pads 121 by filling the conductive material in the openings.

Figure 6:
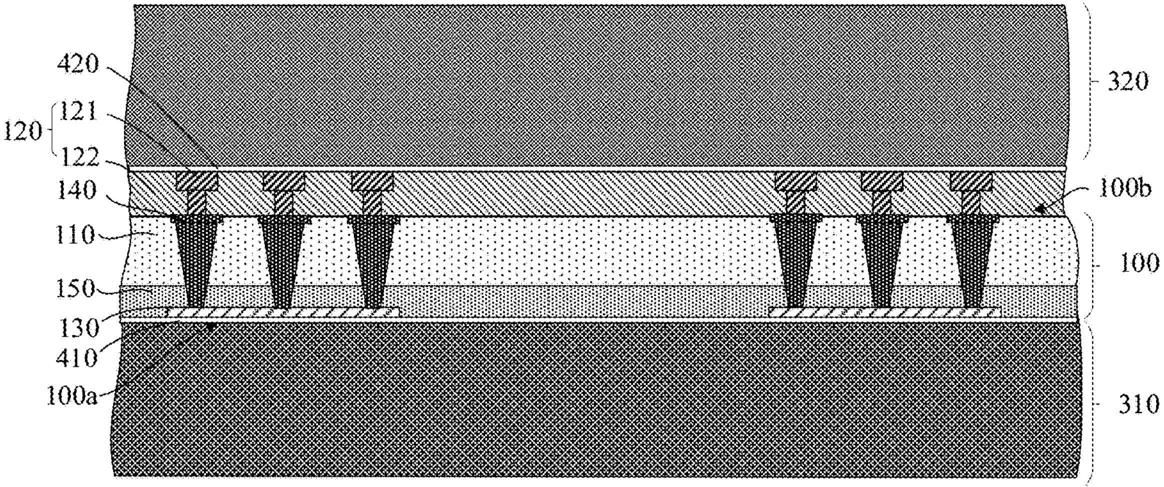

Referring to FIG. 6, in step S300, a second bonding adhesive 420 is coated on the first hybrid bonding structure 120, and a second carrier wafer 320 is temporarily bonded to the back side 100 of the device wafer 100. Likewise, the second carrier wafer 320 may be a single-layer wafer intended only to provide support. Therefore, it may be a substrate that has not undergone any device fabrication process. For example, it may be a silicon substrate. As a result of the temporary bonding of the second carrier wafer 320 and the device wafer 100 achieved by the second bonding adhesive 420, the device wafer 100 is firmly attached to the second carrier wafer 320. As shown in FIG. 6, at this point, the first carrier wafer 310 and the second carrier wafer 320 are bonded to the front side 100*a* and the back side 100*b* of the device wafer 100, respectively.

Figure 7:
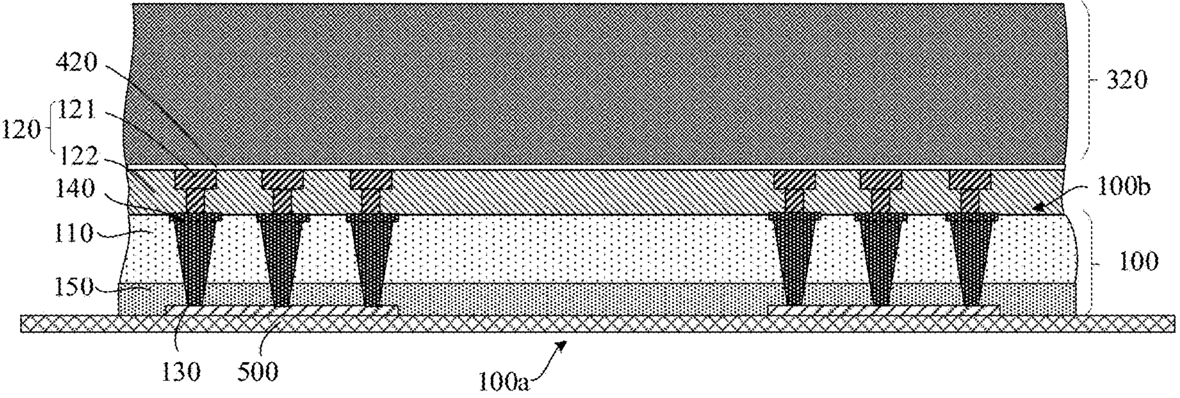

Referring to FIGS. 6 to 7, in step S400, with support of the second carrier wafer 320, the device wafer 100 and the first carrier wafer 310 are debonded, and the first bonding adhesive on the front side 100*a* of the device wafer 100 is removed.

With continued reference to FIGS. 6 to 7, all the dies on the device wafer 100 are tested, and good ones of them (known good dies (KGDs)) are identified and marked. In this way, during the subsequent die bonding, only good ones are bonded at their back sides to a target wafer, and any defective die is discarded. This can result in an increased yield of devices obtained from the bonding. It would be appreciated that, in this embodiment, the aluminum pads on the front side 100*a* of the device wafer 100 are used for the testing. Moreover, compared with testing the device wafer 100 and marking good dies thereon immediately after the completion of the fabrication thereof, testing the device wafer 100 and marking good dies thereon after the back-side connection structure 140 is formed on the back side 100*b* of the device wafer 100 enables screening out of any die that becomes defective during the bonding of the first carrier wafer 310 or during the formation of the back-side connection structure 140, resulting in an increased yield of the resultant bonded dies.

Of course, this is because the device wafer 100 of the embodiment has undergone redistribution layer forming process and aluminum pad forming process and thus has obtained the features for leading out electrical signals. In alternative embodiments, all the dies on the device wafer 100 may be tested and good ones of them may be identified and marked before the first carrier wafer 310 is bonded to the front side 100*a* of the device wafer 100.

With continued reference to FIG. 7, in step S500, an adhesive film 500 is attached to the front side 100*a* of the device wafer 100. The adhesive film 500 may be a thin film with adhesiveness, such as a blue tape or an ultraviolet (UV) tape. The adhesive film 500 is able to adhesively retain every die after the device wafer 100 is diced, thereby enabling the device wafer 100 to maintain its integral wafer shape rather than fall apart after the dicing process. Moreover, the blue or UV tape can protect the semiconductor structures on the back side of the device wafer 100 from contamination in subsequent processes and from oxidization of metal components thereof due to exposure in air.

Figure 8:
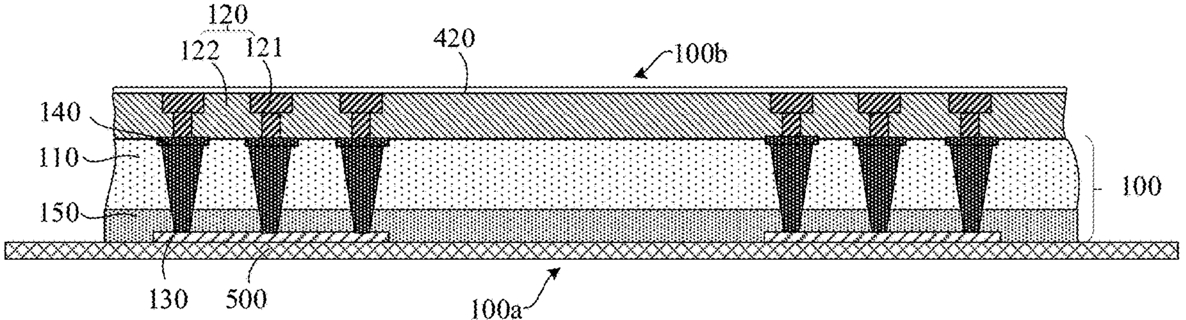

Referring to FIGS. 7 to 8, the device wafer 100 and the second carrier wafer 320 are debonded, and the second carrier wafer 320 is removed. After the debonding, the device wafer 100 is not subject to any adhesive removal process, and the second bonding adhesive 420 is still retained on the back side 100*b* of the device wafer 100. As a result, the second bonding adhesive 420 that still covers the back side 100*b* of the device wafer 100 can protect the bonding interface on the back side 100*b* of the device wafer 100 from contamination in subsequent processes and can prevent metal regions of the bonding interface on the back side 100*b* of the device wafer from being oxidized.

Figure 9:
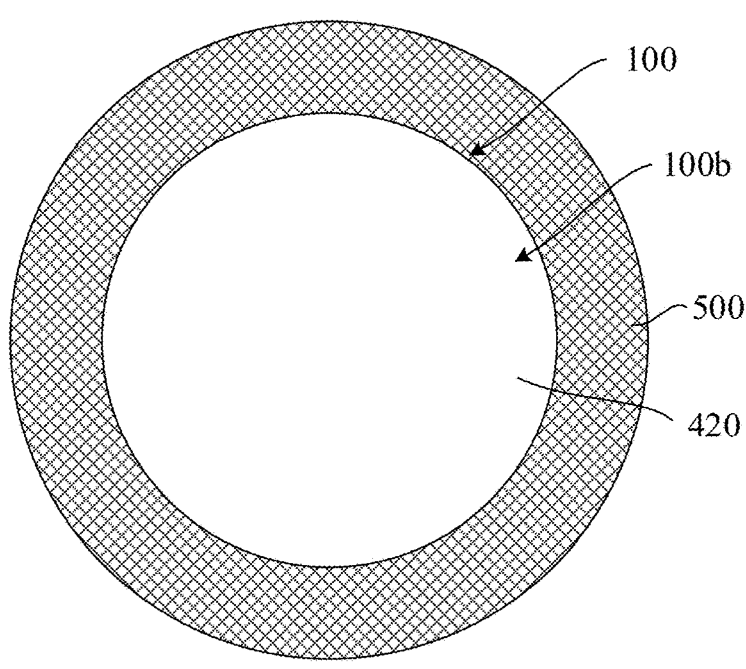
Figure 10:
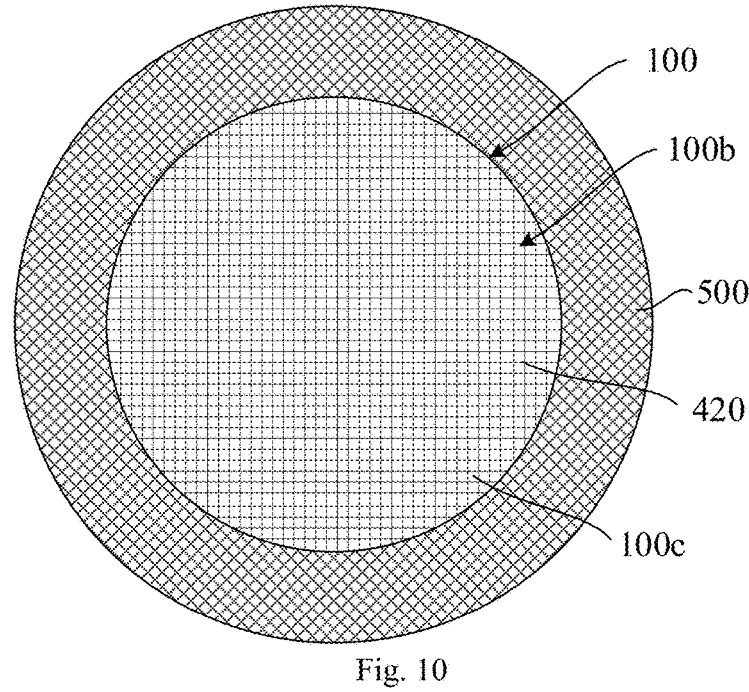

Referring to FIGS. 8 to 10, in step S600, the device wafer 100 is diced from the back side 100*b* of the device wafer 100 into individual dies. The dicing of the device wafer 100 may include the following steps. The device wafer 100 may be first cut from the back side 100*b* with a grinding wheel. The grinding wheel may pass through the second bonding adhesive 420 and the first hybrid bonding structure 120 and stop at the first substrate 110 (or even pass through a partial thickness of the first substrate 110). As a result, horizontal and vertical first dicing lanes may be formed, in which the surface of the first substrate is exposed (or they may extend into the first substrate, without connecting with the second dicing lanes). The first dicing lanes are aligned with the respective second dicing lanes, and adjacent first dicing lanes are separated by the individual dies 100*c*. The device wafer 100 may also be diced into individual dies 100*c* by laser cutting, and for example, a dry etching process may be then performed along the resulting first dicing lanes to etch through the first substrate 110, bringing the second dicing lanes into communication with the respective first dicing lanes. In this way, the device wafer 100 can be separated into the individual dies 100*c*.

In this embodiment, since the first dicing lanes are preformed, the individual dies 100*c* can be separated simply by forming the second dicing lanes and then etching the first substrate 110 along the second dicing lanes to bring the first dicing lanes into communication with the respective second dicing lanes. It would be appreciated that, in alternative embodiments, the step of pre-forming the first dicing lanes may be omitted, and instead, the etching or cutting of the first substrate 110 along the second dicing lanes may be carried out so that the dielectric layer is also etched or cut through. In this way, the individual dies 100*c* can also be separated from another.

Each die 100*c* also has a front side and a back side. The front side of each die 100*c* corresponds to the front side 100*a* of the device wafer 100, and the back side of each die 100*c* corresponds to the back side 100*b* of the device wafer 100. Thus, each die 100*c* has, on its back side, part of the first hybrid bonding structure 120 and part of the back-side connection structure 140.

It would be appreciated that, the individual dies 100*c* can be adhesively retained by the adhesive film 500, at this time, the device wafer 100 still maintains its integral wafer shape.

With continued reference to FIGS. 8 to 10, particles may be produced during the cutting of the second bonding adhesive 420 and the first hybrid bonding structure 120 by the grinding wheel. Moreover, etching by-products are usually produced during the etching process on the first substrate 110. Such particles and etching by-products tend to adhere to the back side 100*b* of the device wafer 100. In this embodiment, since the back side 100*b* of the device wafer 100 is covered by the second bonding adhesive 420, the particles and etching by-products will adhere to the second bonding adhesive 420 and may be subsequently removed together with the second bonding adhesive 420. This ensures cleanness of the back sides of the dies 100*c*, resulting in improved quality of bonding of the dies 100*c* at their back sides to the target wafer.

Additionally, in order to avoid damage to the back side 100*b* of the device wafer 100 during the etching of the first substrate 110 and the first dielectric layer 150, conventionally, before the first substrate 110 is etched, a layer of photoresist is usually formed on the back side 100*b* of the device wafer 100 and then exposed to result in exposure of the first dicing lanes. In this embodiment, as the etchant used in the etching of the first substrate 110 and the first dielectric layer 150 generally exhibits a high selectivity to the adhesive, the second bonding adhesive 420 on the back side 100*b* of the device wafer 100 can function in the same way as photoresist to protect the back side 100*b* of the device wafer 100 against possible damage that may be caused by the etching process, dispensing with the need for additional photoresist coating and exposure. This results in increases in process simplicity and production efficiency. Further, the first carrier wafer 310 is debonded after the second bonding adhesive 420 is coated and the second carrier wafer 320 is bonded. With the back side 100*b* of the device wafer 100 being protected by the second bonding adhesive 420, no process step or process complexity will be added.

Figure 11:
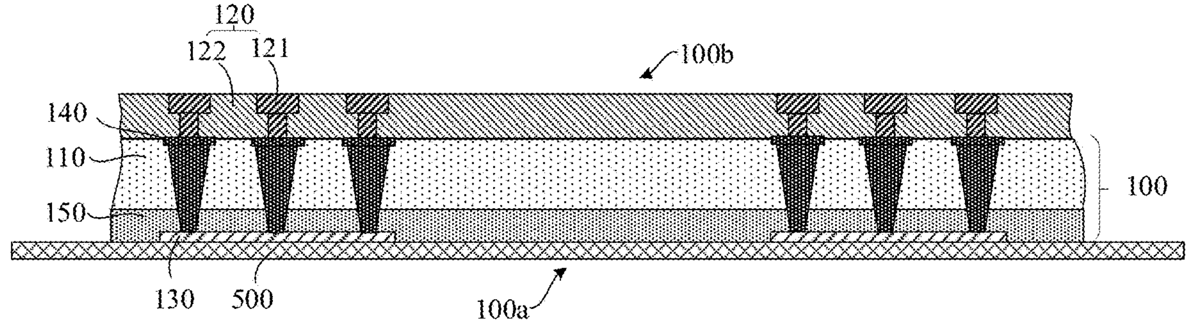

Referring to FIGS. 10 to 11, in step S700, after the device wafer 100 is diced, the second bonding adhesive 420 on the back side 100*b* of the device wafer 100 is removed. In this embodiment, the second bonding adhesive 420 may be removed along with particles or etching by-products adhering to its surface by a wet cleaning process, thereby ensuring cleanness of the back sides of the dies 100*c*.

Figure 2B:
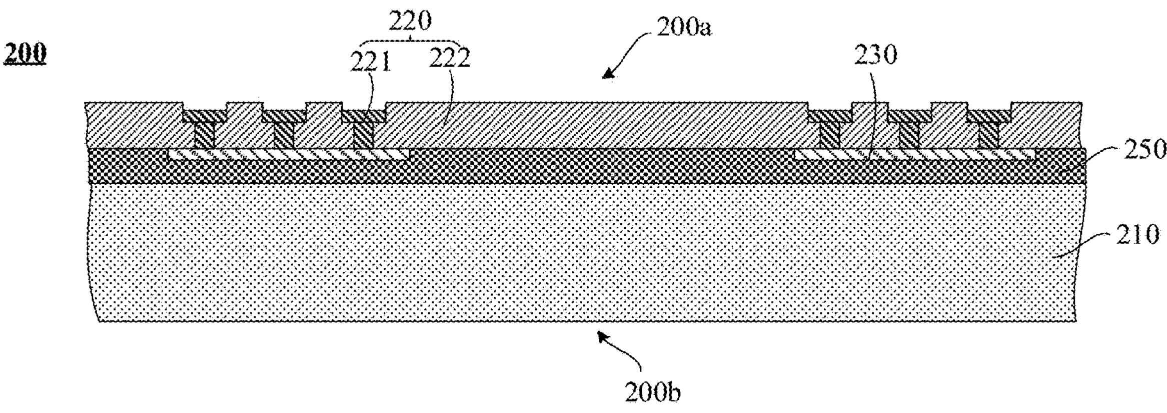

Referring to FIG. 2*b*, a target wafer 200 is provided, which includes a second substrate 210 and a second hybrid bonding structure 220 formed on the second substrate 210. Second device structures are formed in the second substrate 210, and a second interconnect structure 230 electrically connected to the second device structures are formed on the second substrate 210. The second interconnect structure 230 is embedded in a second dielectric layer 250. The second dielectric layer 250 may include multiple layers. For example, it may include an interlayer dielectric layer and an inter-metal dielectric layer. The second interconnect structure 230 is wrapped by the dielectric material. The second device structures may be MOS devices, sensor devices, storage devices and/or other passive devices.

The second interconnect structure 230 may include multiple layers (represented by one layer in FIG. 2*b* for the illustrative purpose). The layers may be interconnected by electrical connections such as contact plugs, wiring layers, and/or vias. The second interconnect structure 230 may be formed of a metal material such as tungsten, aluminum or copper.

The target wafer 200 also has a front side 200*a* and a back side 200*b*. The second interconnect structure 230 is formed on the front side 200*a* of the target wafer 200, and the back side 200*b* is opposite the front side 200*a*.

The second hybrid bonding structure 220 is formed on the second dielectric layer 250. The second hybrid bonding structure 220 has a bonding interface formed by different bonding materials. In this embodiment, the second hybrid bonding structure 220 includes a second insulating bonding layer 222 and second conductive bonding pads 221. The second conductive bonding pads 221 are embedded in the second insulating bonding layer 222 and electrically connected to the second interconnect structure 230. Generally, the second conductive bonding pads 221 are formed on the second interconnect structure 230 and electrically connected to interconnecting wires on the top of the second interconnect structure 230, thereby electrically leading out the second interconnect structure 230.

Optionally, the second insulating bonding layer 222 may be a dielectric material suitable for bonding. It may consist of a single layer or stacked multiple layers. For example, it may consist of silicon oxide, silicon nitride, silicon oxynitride, nitrogen-doped silicon carbide (NDC) or a combination thereof. The second conductive bonding pads 221 are made of a conductive bonding material such as a metal bonding material such as copper, gold or an alloy.

The formation of the second hybrid bonding structure 220 may include: forming an insulating layer on the front side 200*a* of the target wafer 200; etching the insulating layer to form openings therein; and finally, forming the second conductive bonding pads 221 by filling the conductive material in the openings. The remainder of the insulating layer forms the second insulating bonding layer 222.

With continued reference to FIGS. 2*a* to 2*b*, it would be appreciated that the first hybrid bonding structure 120 matches the second hybrid bonding structure 220. That is, the first conductive bonding pads 121 are aligned with the respective second conductive bonding pads 221, and the first insulating bonding layer 122 with the second insulating bonding layer 222. In this way, they can be bonded together by dielectric-to-dielectric bonds and metal-to-metal bonds.

Additionally, in this embodiment, top surfaces of the first conductive bonding pads 121 are flush with a top surface of the first insulating bonding layer 122, and top surfaces of the second conductive bonding pads 221 are lower than a top surface of the second insulating bonding layer 222. In this way, after bonding, the top surface of the first insulating bonding layer 122 adheres to the top surface of the second insulating bonding layer 222, while gaps are left between the top surfaces of the first conductive bonding pads 121 and the top surfaces of the second conductive bonding pads 221. The first conductive bonding pads 121 and the second conductive bonding pads 221 will expand when heated during bonding, and the gaps can prevent overflow of the materials of the first conductive bonding pads 121 and the second conductive bonding pads 221 when they expand and squeeze each other, which may lead to a short circuit. In alternative embodiments, the top surfaces of the first conductive bonding pads 121 may be higher or lower than the top surface of the first insulating bonding layer 122. In these embodiments, the top surfaces of the second conductive bonding pads 221 may be accordingly adjusted in height to ensure that there are gaps between the first conductive bonding pads 121 and the second conductive bonding pads 221. Of course, the gaps should be sized according to the materials of the first conductive bonding pads 121 and the second conductive bonding pads 221 in order to ensure that the top surfaces of the first conductive bonding pads 121 adhere to the top surfaces of the second conductive bonding pads 221 after bonding.

Further, in this embodiment, the first conductive bonding pads 121 and the second conductive bonding pads 221 are both made of copper, which is susceptible to oxidation that may lead to degraded bonding quality. The second bonding adhesive 420 retained on the back side 100*b* of the device wafer 100 can prevent to some extent the first conductive bonding pads 121 from being oxidized (and the second conductive bonding pads 221 may be coated with a special protective layer which can prevent their oxidation), resulting in improved bonding quality.

In this embodiment, the front side 200*a* of the target wafer 200 may also have undergone redistribution layer forming process and aluminum pad forming process. Therefore, the good dies can be bonded at their back sides to the front side 200*a* of the target wafer 200.

With continued reference to FIGS. 2*b* and 11, in this embodiment, after the second bonding adhesive 420 is removed, the first insulating bonding layer 122 in the first hybrid bonding structure 120 may be preferably activated with plasma to have enhanced bonding strength. In alternative embodiments, as shown in FIG. 2*b*, the second insulating bonding layer 222 in the second hybrid bonding structure 220 may be activated with plasma to have enhanced bonding strength. Alternatively, both the first insulating bonding layer 122 in the first hybrid bonding structure 120 and the second insulating bonding layer 222 in the second hybrid bonding structure 220 may be activated with plasma.

Figure 12:
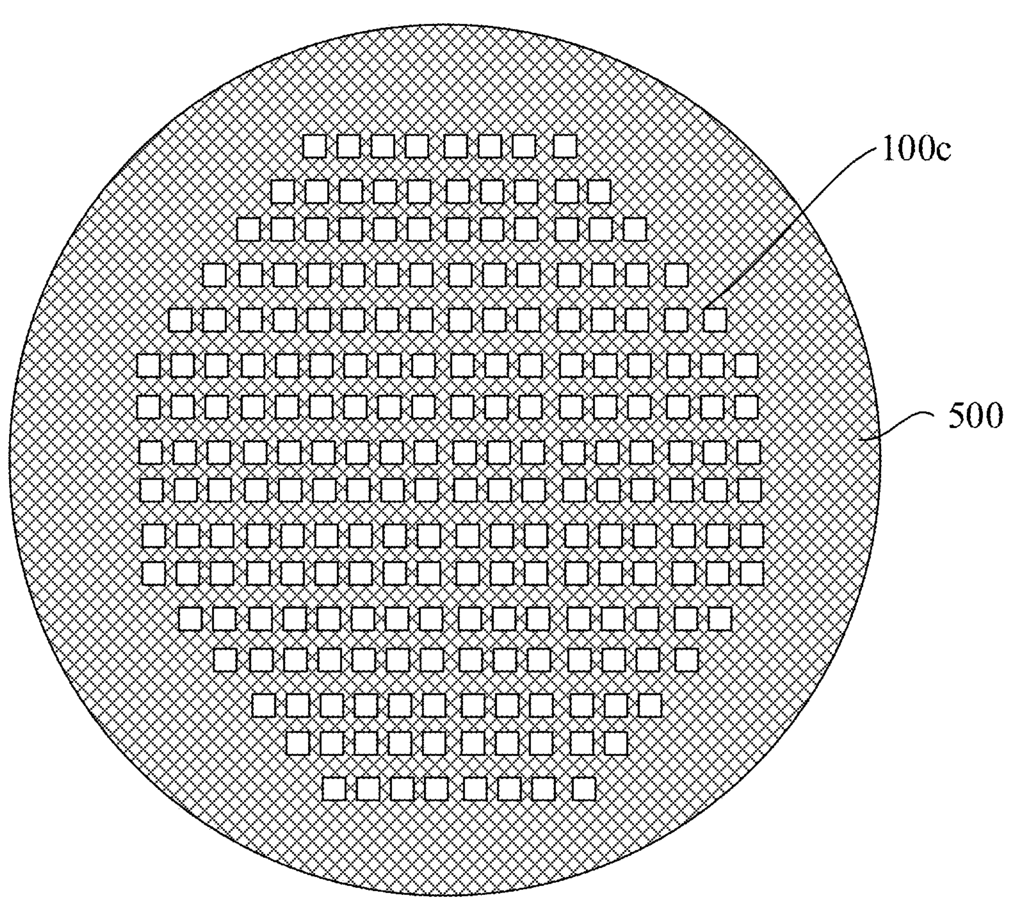

With continued reference to FIG. 12, the adhesive film 500 may be stretched to widen the gaps between adjacent dies 100*c*, thereby facilitating removal of the good dies from the adhesive film 500.

Figure 13:
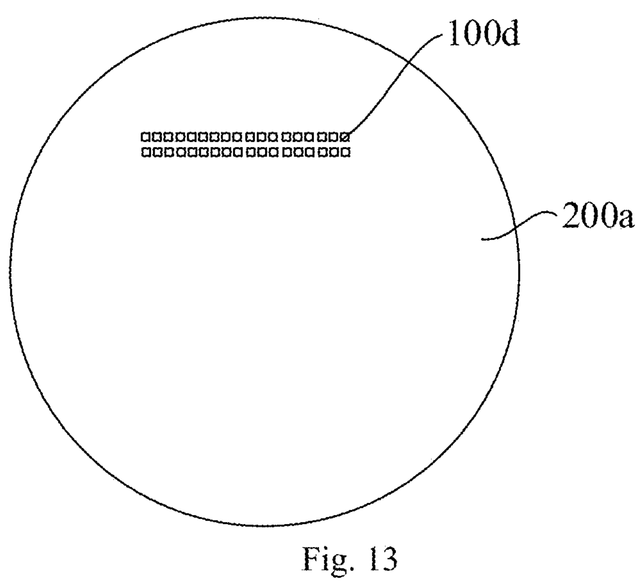

Referring to FIGS. 11 to 13, in conjunction with FIG. 2*b*, the good dies 100*d* are picked up from the adhesive film 500 by a die transfer device, such as a die transfer device equipped with a suction cup, and aligned with and bonded at the back sides of the good dies 100*d* to target regions of the front side 200*a* of the target wafer 200. Preferably, the target wafer 200 may also have been tested, and good dies on the target wafer 200 have been identified and marked. The good dies 100*d* may be aligned with and bonded to only good dies on the target wafer 200. Each good die on the target wafer 200 has part of the second hybrid bonding structure 220 on its front side. Each good die 100*d* from the device wafer 100 is aligned with a respective good die on the target wafer 200, and the two are then bonded together by means of bonds formed between the first hybrid bonding structure 120 of the good die 100*d* from the device wafer 100 and the second hybrid bonding structure 220 of the good die on the target wafer 200. In this way, it is ensured that each pair of bonded die is good, resulting in an increased yield of device fabricated from such pairs, avoiding wasting of dies and reducing rework.

Optionally, bonding the back sides of the good dies 100*d* from the device wafer 100 to the front sides of the good dies on the target wafer 200 may include the steps as follows.

At first, the good dies 100*d* on the device wafer 100 may be picked up from the adhesive film 500, and the locations of the good dies on the target wafer 200 may be determined. For ease of description, the good dies 100*d* from the device wafer 100 are referred to hereinafter as first dies, and the good dies on the target wafer 200 as second dies. Next, the first conductive bonding pads 121 in the first hybrid bonding structure 120 on the back sides of the first dies may be aligned with the second conductive bonding pads 221 in the second hybrid bonding structure 220 on the front side of the second dies, and the first insulating bonding layer 122 in the first hybrid bonding structure 120 on the back sides of the first dies with the second insulating bonding layer 222 in the second hybrid bonding structure 220 on the front side of the second dies, followed by performing a hybrid bonding process.

In the hybrid bonding process, since the first insulating bonding layer 122 and/or the second insulating bonding layer 222 have been activated with plasma, the good dies may be pre-bonded to the target wafer 200 simply by van der Waals forces at room temperature and atmospheric pressure. This reduces requirements on the bonding process and broadens the process window. After all the good dies have been pre-bonded to the target wafer 200, an annealing process can be performed to permanently bond the good dies to the target wafer 200 in one pass.

In addition, the time interval from the formation of the first hybrid bonding structure 120 on the back side 100*b* of the device wafer 100 to the coating of the second bonding adhesive 420 on the first hybrid bonding structure 120 is defined as a first waiting time, and the time interval from the removal of the second bonding adhesive 420 to the bonding of the good dies 100*d* from the device wafer 100 at their back sides to the target wafer 200 with the aid of the first hybrid bonding structure 120 and the second hybrid bonding structure 220 as a second waiting time. Since the first hybrid bonding structure 120 is exposed during the first and second waiting times, the sum of the first and second waiting times is desirably controlled within 24 hours or shorter, in order to additionally prevent the first conductive bonding pads 121 from being oxidized. In this embodiment, as the second bonding adhesive 420 is coated on the back side 100*b* of the device wafer 100 as soon as the first hybrid bonding structure 120 is formed, the first waiting time can be effectively shortened, enabling effective control of the sum of the first and second waiting times. In this way, oxidation of the bonding structure can be prevented, resulting in improved bonding quality.

Additionally, in this embodiment, the first hybrid bonding structure 120 and the second hybrid bonding structure 220 are formed successively, and the second hybrid bonding structure 220 can be formed at any desired time before the final bonding process, more preferably at a time closer to the final bonding process. This can shorten the time in which the second hybrid bonding structure 220 is exposed in air and thus prevent the second hybrid bonding structure 220 from being oxidized. However, it would be appreciated that the first hybrid bonding structure 120 and the second hybrid bonding structure 220 may alternatively be formed in the same time. In this case, after being formed, the second hybrid bonding structure 220 may be coated with a protective layer capable of isolating the second hybrid bonding structure 220 from external air.

It would be appreciated that although the good dies have been described in the above embodiments as being bonded to the front side of the target wafer as an example, in practical applications with the target wafer consisting of two or more wafers bonded together, the good dies may be alternatively bonded to a back side of the target wafer. However, a detailed description in this regard is omitted for brevity.

In summary, in the die bonding method provided in embodiments of the present invention, through temporarily bonding the first carrier wafer to the front side of the device wafer, the back-side connection structure can be formed on the back side of the device wafer to lead out the interconnect structure in the device wafer to the back side of the device wafer. Moreover, through bonding the second carrier wafer to the back side of the device wafer, the first carrier wafer can be debonded. Further, after the device wafer and the second carrier wafer are debonded, the second bonding adhesive is retained, in order to provide protection to the back side of the device wafer during the subsequent dicing of the device wafer, and to avoid particles or etching by-products produced during the dicing process from adhering to the back side of the device wafer. Such particles or etching by-products are subsequently removed along with the second bonding adhesive, ensuring cleanness of the back sides of the individual dies resulting from the dicing process and improved quality of bonding of the back sides of the dies to the target wafer.

Additionally, during the dicing of the device wafer, the second bonding adhesive remaining on the front side of the device wafer can function in the same way as photoresist. As the etchant used in the etching of the substrate generally shows a high selectivity to the adhesive, the adhesive can protect the front side of the device wafer against possible damage that may be caused by the etching process, thus dispensing with the need for additional photoresist coating and exposure. This results in increases in process simplicity and production efficiency.

Further, the first carrier wafer is debonded after the second bonding adhesive is coated and the second carrier wafer is bonded. With the back side of the device wafer being protected by the second bonding adhesive, no process step or process complexity will be added.

Further, the conductive bonding pads in the first hybrid bonding structure are often made of copper, which is susceptible to oxidation that may lead to degraded bonding quality. The second bonding adhesive retained after the device wafer is debonded from the second carrier wafer can prevent to some extent the conductive bonding pads in the first hybrid bonding structure from being oxidized, resulting in improved bonding quality.

Further, the time interval from the formation of the first hybrid bonding structure on the back side of the device wafer to the coating of the second bonding adhesive on the first hybrid bonding structure is defined as a first waiting time, and the time interval from the removal of the second bonding adhesive to the bonding of the good dies from the device wafer at their back sides to the target wafer with the aid of the first and second hybrid bonding structures as a second waiting time. Since the conductive bonding pads in the first hybrid bonding structure is exposed in air during the first and second waiting times, the sum of the first and second waiting times is controlled within 24 hours or shorter, thereby additionally preventing the conductive bonding pads in the first hybrid bonding structure from being oxidized.

Further, compared with testing the device wafer and marking good dies thereon after the completion of the fabrication thereof, testing the device wafer and marking good dies thereon after the removal of the first bonding adhesive enables screening out of any die that becomes defective during the bonding of the first carrier wafer or during the formation of the back-side connection structure, resulting in an increased yield of the resultant bonded dies.

Further, after the second bonding adhesive is removed and before the good dies are bonded at their back sides to the target wafer, the insulating bonding layer(s) in the first hybrid bonding structure and/or the second hybrid bonding structure may be activated with plasma to enhance its/their bonding strength. As a result, the good dies can be pre-bonded to the target wafer at room temperature and atmospheric pressure, reducing the requirements on the bonding process and broadening the process window.

It is to be noted that the embodiments disclosed herein are described in a progressive manner with the description of each embodiment focusing on its differences from others, and reference can be made between the embodiments for their identical or similar parts. Since the system embodiments correspond to the method embodiments, they are described relatively briefly, and reference can be made to the method embodiments for details of the system embodiments.

It is also to be noted that while the present invention has been described with reference to several preferred embodiments, the forgoing embodiments are not intended to limit the invention. In light of the teachings hereinabove, any person familiar with the art may make various possible variations and changes to the disclosed embodiments or modify them into equivalent alternatives, without departing from the scope thereof. Accordingly, any and all such simple variations, equivalent alternatives and modifications made to the foregoing embodiments without departing from the scope of the invention are intended to fall within the scope thereof.

Further, it is also to be recognized that the terminology used herein is for the purpose of describing particular embodiments only, and is not intended to limit the scope of the present invention. It must be noted that as used herein and in the appended claims, the singular forms “a” and “an” include the plural reference unless the context clearly dictates otherwise. Thus, for example, a reference to “a step” or “a means” is a reference to one or more steps or means and may include sub-steps and sub-means. All conjunctions used are to be understood in the most inclusive sense possible. Thus, the term “or” should be understood as having the definition of a logical “or” rather than that of a logical “exclusive or” unless the context clearly necessitates otherwise. Further, implementation of the method and/or device according to the embodiments of the present invention may involve performing selected tasks manually, automatically, or a combination thereof.

Presented above are merely a few preferred embodiments of the present invention, which do not limit the invention in any way. Changes in any forms made to the principles and teachings disclosed herein, including equivalents and modifications, by any person of ordinary skill in the art without departing from the scope of the invention are intended to fall within the scope of the invention.

What is claimed is:

1. A die bonding method, comprising:

providing a device wafer, coating a first bonding adhesive on a front side of the device wafer and temporarily bonding a first carrier wafer to the front side of the device wafer;

forming a first hybrid bonding structure on a back side of the device wafer;

coating a second bonding adhesive on the first hybrid bonding structure and temporarily bonding a second carrier wafer to the first hybrid bonding structure;

debonding the device wafer and the first carrier wafer, and removing the first bonding adhesive;

debonding the device wafer and the second carrier wafer, and the second bonding adhesive being retained;

dicing the device wafer from the back side of the device wafer, thereby separating the device wafer into a plurality of individual dies; and removing the second bonding adhesive and providing a target wafer, a surface of the target wafer having a second hybrid bonding structure formed thereon, and bonding back sides of good dies to the target wafer with an aid of the first hybrid bonding structure and the second hybrid bonding structure.

2. The die bonding method of claim 1, wherein all the dies on the device wafer are tested to mark the good dies, before the first bonding adhesive is coated on the front side of the device wafer.

3. The die bonding method of claim 1, further comprising attaching an adhesive film to the front side of the device wafer, after the first bonding adhesive is removed; and testing all the dies on the device wafer to mark the good dies, after the first bonding adhesive is removed and before the adhesive film is attached to the front side of the device wafer.

4. The die bonding method of claim 1, further comprising, before the first hybrid bonding structure is formed on the back side of the device wafer, forming a back-side connection structure on the back side of the device wafer, the back-side connection structure electrically connected to a first interconnect structure in the device wafer, the back-side connection structure comprising through-silicon vias (TSVs) and pads.

5. The die bonding method of claim 1, wherein the device wafer comprises a substrate, a dielectric layer on the substrate and a first interconnect structure formed in the dielectric layer, wherein the step of dicing the device wafer from the back side thereof into the individual dies comprises:

cutting at least the second bonding adhesive and the first hybrid bonding structure from the back side of the device wafer to form horizontal and vertical first dicing lanes, the first dicing lanes exposing a surface of the substrate or extending into the substrate; and performing an etching process along the first dicing lanes, which proceeds downward at least through the substrate, thereby completely separating adjacent dies.

6. The die bonding method of claim 5, after the etching process proceeds along the first dicing lanes downward through the substrate, the dielectric layer is etched or cut through, thereby completely separating adjacent dies; or second dicing lanes are pre-formed in the dielectric layer before the horizontal and vertical first dicing lanes are formed, the second dicing lanes extending at least through the dielectric layer and defining the individual dies, wherein the first dicing lanes are aligned with the respective second dicing lanes, and the etching process proceeds along the first dicing lanes downward until the second dicing lanes connect with the respective first dicing lanes, thereby separating adjacent dies.

7. The die bonding method of claim 3, after the second bonding adhesive is removed, the adhesive film is stretched to widen gaps between adjacent dies.

8. The die bonding method of claim 4, wherein each of the first and second hybrid bonding structures comprises an insulating bonding layer and conductive bonding pads, the conductive bonding pads located within the insulating bonding layer, the conductive bonding pads in the first hybrid bonding structure electrically connected to the back-side connection structure, the conductive bonding pads in the second hybrid bonding structure electrically connected to a second interconnect structure in the target wafer.

9. The die bonding method of claim 8, after the second bonding adhesive is removed and before the back sides of the good dies are bonded to the target wafer with the aid of the first and second hybrid bonding structures, the insulating bonding layer of the first hybrid bonding structure and/or the second hybrid bonding structure is activated with plasma.

10. The die bonding method of claim 8, wherein a material of the conductive bonding pads in the first hybrid bonding structure comprises copper, wherein an time interval from the formation of the first hybrid bonding structure on the back side of the device wafer to the coating of the second bonding adhesive on the first hybrid bonding structure is defined as a first waiting time and a time interval from the removal of the second bonding adhesive to the bonding of the back sides of the good dies to the target wafer with the aid of the first and second hybrid bonding structures as a second waiting time, and a sum of the first and second waiting time is shorter than or equal to 24 hours.

11. The die bonding method of claim 1, wherein both the device wafer and the target wafer have undergone a redistribution layer forming process and an aluminum pad forming process.

12. The die bonding method of claim 1, wherein the second bonding adhesive is removed using a wet cleaning process.

13. The die bonding method of claim 2, further comprising attaching an adhesive film to the front side of the device wafer, after the first bonding adhesive is removed; and testing all the dies on the device wafer to mark the good dies, after the first bonding adhesive is removed and before the adhesive film is attached to the front side of the device wafer.

* * * * *